(12) United States Patent
Tran (10) Patent No.: US 7,615,789 B2
(45) Date of Patent: Nov. 10, 2009

(54) VERTICAL LIGHT EMITTING DIODE DEVICE STRUCTURE

(75) Inventor: Anh Chuong Tran, Baoshan Township, Hsinchu County (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 11/382,392

(22) Filed: May 9, 2006

(65) Prior Publication Data

US 2007/0278506 A1   Dec. 6, 2007

(51) Int. Cl.
*H01L 27/15* (2006.01)
(52) U.S. Cl. .............................. 257/79; 257/98; 257/99; 257/100; 257/101; 257/103; 257/E29.089; 257/E33.001; 257/E33.055; 257/94
(58) Field of Classification Search .................. 257/79, 257/103, 98, 99, 100, 101, 102, 94, E21.089, 257/E33.001, E33.055; 438/21
See application file for complete search history.

(56) References Cited

U.S. PATENT DOCUMENTS

| | | | |
|---|---|---|---|
| 4,184,170 A * | 1/1980 | Burnham et al. ............... 257/97 |
| 6,081,001 A | 6/2000 | Funato et al. | |
| 6,319,778 B1 | 11/2001 | Chen et al. | |
| 6,809,341 B2 * | 10/2004 | Hsu et al. ...................... 257/79 |
| 6,833,564 B2 * | 12/2004 | Shen et al. ..................... 257/94 |
| 2005/0110037 A1 * | 5/2005 | Takeda et al. ................ 257/103 |
| 2005/0145877 A1 * | 7/2005 | Erchak ........................ 257/103 |
| 2006/0154389 A1 * | 7/2006 | Doan ........................... 438/21 |
| 2006/0289891 A1 * | 12/2006 | Hutchins ..................... 257/103 |
| 2007/0045638 A1 * | 3/2007 | Shen et al. ..................... 257/94 |

OTHER PUBLICATIONS

PCT International Search Report dated Apr. 23, 2008.

* cited by examiner

*Primary Examiner*—Cuong Q Nguyen
*Assistant Examiner*—Trang Q Tran
(74) *Attorney, Agent, or Firm*—Patterson & Sheridan, LLP (57) ABSTRACT

A vertical light-emitting diode (VLED) structure that may impart increased luminous efficiency over conventional LEDs and VLEDs is described. As additional benefits, some embodiments may have less susceptibility to electrostatic discharge (ESD) and higher manufacturing yields than conventional devices. To accomplish these benefits, embodiment of the invention may utilize a spacer or other means to separate the p-doped layer from the active layer, thereby increasing the distance between the active layer and the reflective layer within the VLED structure.

18 Claims, 6 Drawing Sheets

FIG. 6

VERTICAL LIGHT EMITTING DIODE DEVICE STRUCTURE

BACKGROUND OF THE INVENTION

1. Field of the Invention

Embodiments of the present invention generally relate to the field of light-emitting diode (LED) technology and, more particularly, to a vertical light-emitting diode (VLED) structure.

2. Description of the Related Art

Luminous efficiency can be defined as the total apparent power of a light source to its actual total input power (luminous flux divided by input power). Having units of lumens per watt, luminous efficiency measures the fraction of power which is useful for lighting. As a type of light source, light-emitting diodes (LEDs) have been designed and developed over the past few decades to make improvements in luminous efficiency and increase the number of possible applications for these solid state devices.

Figure 1:
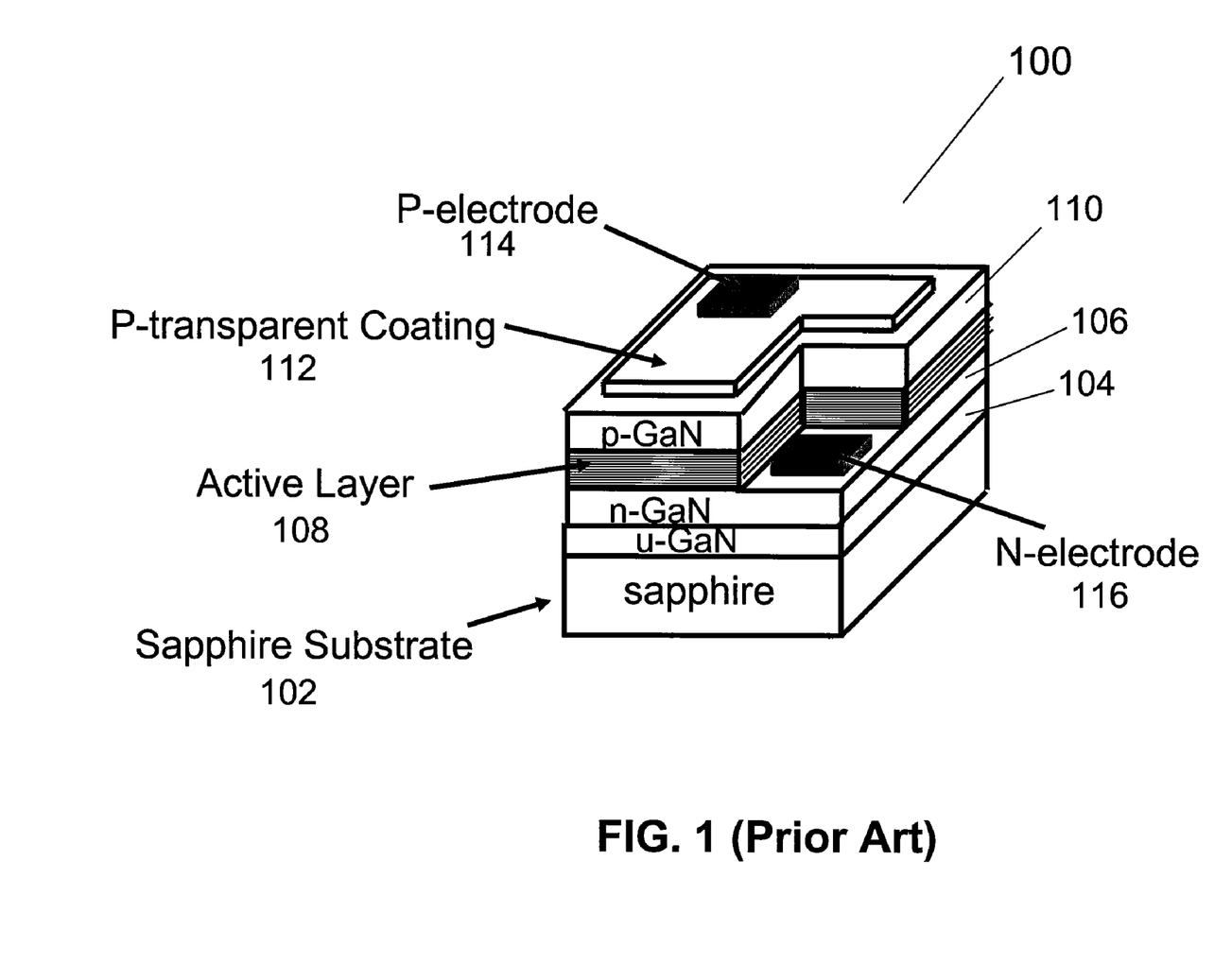
FIG. 1 is a cross-sectional schematic representation of a prior art light-emitting diode (LED) structure.

Beginning with a conventional LED structure whose cross-section is shown in FIG. 1, one can see why the luminous efficiency of these devices is poor. A conventional LED 100 is formed on a substrate 102 such as sapphire, silicon carbide, silicon, germanium, ZnO or gallium arsenide depending on the composition of the LED layers to be deposited. In FIG. 1, the GaN LED 100 is grown on a sapphire substrate 102. An undoped layer 104 may be deposited on the substrate 102, and this layer 104 comprises undoped GaN in FIG. 1. An n-doped layer 106 is disposed above the substrate 102 (and the undoped layer 104 if it is present), and this layer 106 comprises n-doped GaN in the figure. A multiple quantum well (MQW) active layer 108 is deposited above the n-doped layer 106, and this is where photon generation occurs when the diode is properly biased. A p-doped layer 110 is grown above the active layer 108, and FIG. 1 depicts this layer 110 comprising p-doped GaN as an example. Since the conductivity of some p-doped layers 110 is very poor, a semi-transparent coating 112 may be applied above the p-doped layer 110 and may comprise Ni/Au or indium tin oxide (ITO). This coating 112 acts as a contact layer facilitating the dispersion of current. A p-electrode 114 for external connection is added above the p-doped layer 110 (or above the semi-transparent coating 112 if it was present). An n-electrode 116 is connected to the n-doped layer 106 for external connection.

For the conventional GaN LED 100 on a sapphire substrate 102, the p-GaN layer 110 may be kept as thin as possible for two reasons. First, the p-GaN layer 110 contains mid-gap states that may absorb the photons emitted from the active layer 108, thereby decreasing luminous efficiency with increased p-GaN layer thickness. Second, the growth of the p-GaN layer 110 occurs at a high temperature, which may harm the active layer 108 formed at a much lower temperature.

Figure 2:
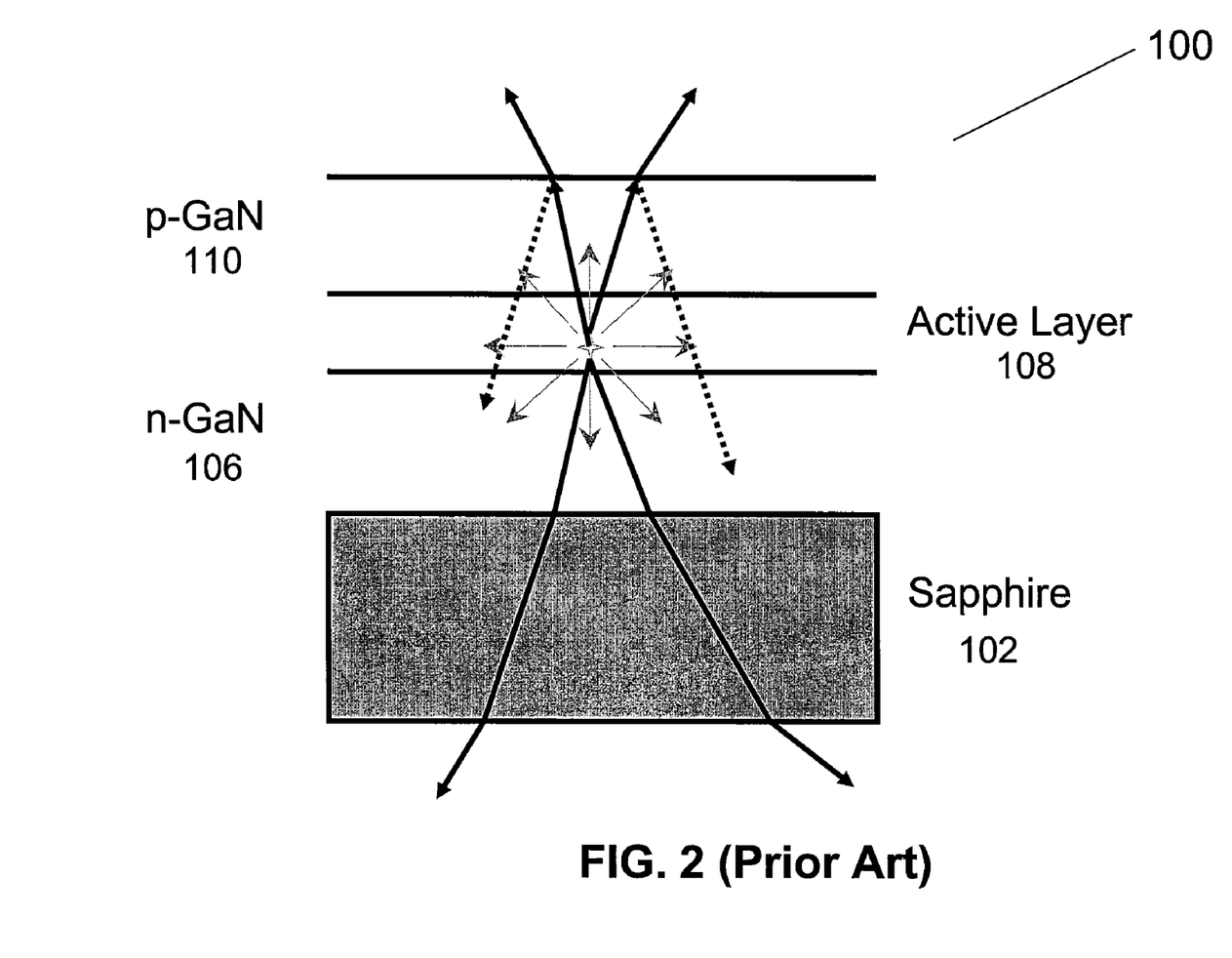
FIG. 2 is a diagram illustrating possible paths of photons for a conventional LED.

FIG. 2 illustrates possible paths of photons for the conventional LED structure of FIG. 1. Photons generated in the active layer 108 are radiated and travel through the different layers of the LED 100. Some photons travel through the p-doped layer 110 and are emitted as output light. The more of these photons that are emitted as output light for the same amount of applied power, the higher the luminous efficiency will be. As previously mentioned, however, the mid-gap states of the p-doped layer 110 may absorb many of the photons. Also, some of the photons travel through the p-doped layer 110 and are reflected back due to the two different indices of refraction at an interface between two disparate entities according to Snell's Law. These reflected photons are further absorbed or travel through the p-doped layer 110, the active layer 108 and the n-doped layer 106. Some of the photons generated in the active layer 108 travel directly to the n-doped layer 106 and on into the substrate 102 where they do not contribute to the emitted light whatsoever. The conventional LED 100 suffers from poor light extraction due to the relatively large quantity of photons that are absorbed or misdirected.

Figure 3:
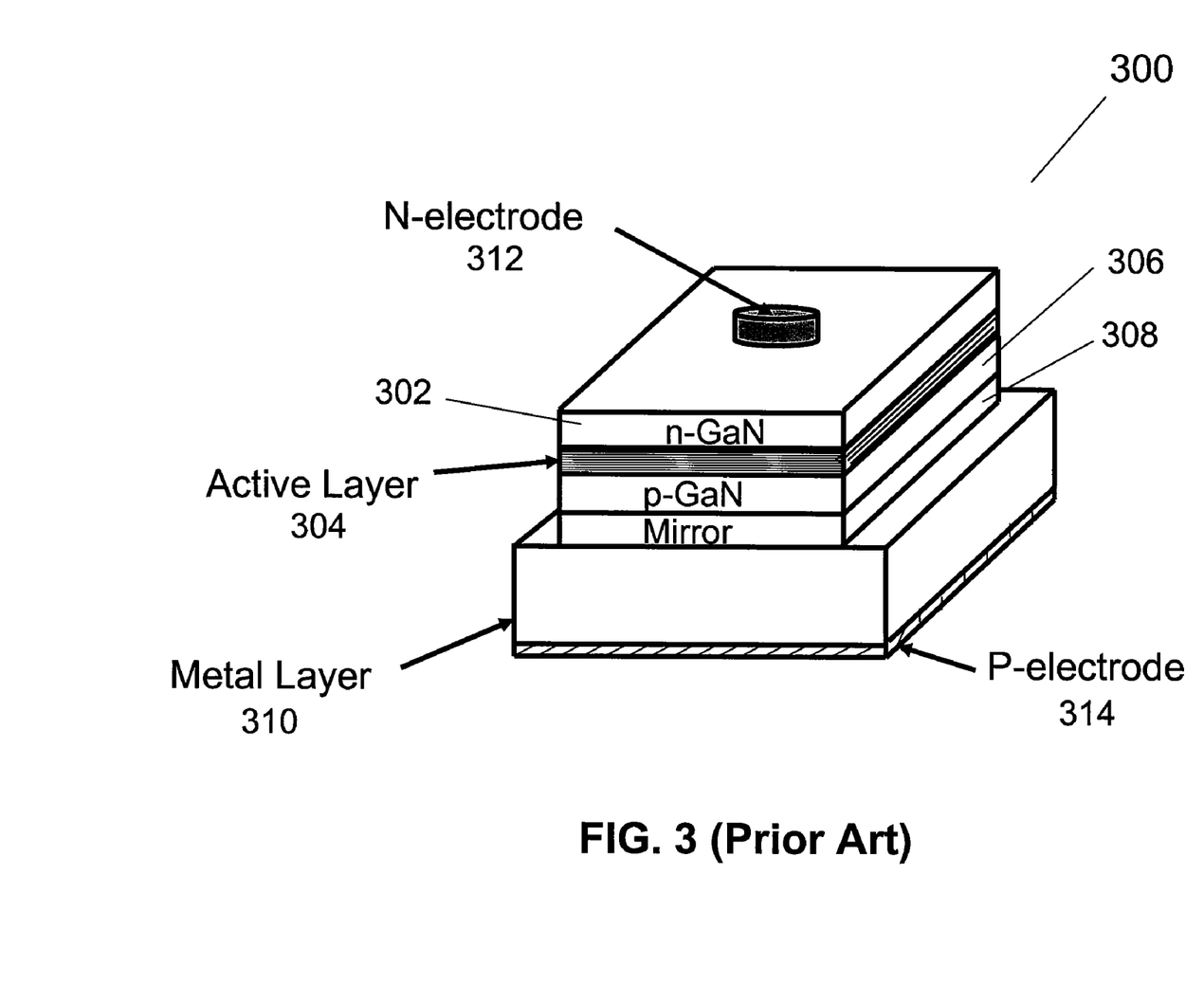
FIG. 3 is a cross-sectional schematic representation of a prior art vertical light-emitting diode (VLED) structure.

To improve upon some of the design limitations for luminous efficiency of conventional LEDs, the vertical light-emitting diode (VLED) structure was created. The VLED earned its name because the current flows vertically from p-electrode to n-electrode, and a typical VLED 300 is shown in FIG. 3. To create the VLED 300, an n-doped layer 302 is deposited on a substrate (not shown), and this may comprise n-GaN, as shown in the figure, or a combination of undoped GaN and n-GaN. A multiple quantum well (MQW) active layer 304 from which the photons are emitted is grown above the n-doped layer 302. A p-doped layer 306 is deposited above the active layer 304, and FIG. 3 depicts p-GaN as an example. This p-GaN layer 306 is kept as thin as possible to prevent harming the active layer 304 during deposition and to reduce absorption by the mid-gap states as mentioned above.

A reflective layer 308 may be formed above the p-doped layer 306, and then a thick conductive metal layer 310 is created above the reflective layer 308. In addition to allowing handling of the VLED devices after the removal of the initial substrates, the metal layer 310 dissipates heat more effectively than substrates, such as silicon and sapphire, of conventional LEDs. The reflective layer 308 is strategically placed to reflect errant photons back into the intended direction of light emission. The reflective layer 308 prevents photons from traveling beyond the semiconductor layers 302, 304, 306 and into the substrate for absorption. Heat dissipation away from the active layer 304 and reflection of wayward photons improve luminous efficiency.

Once the metal layer 310 is formed, a series of handling operations occurs that, in effect, flip the structure over and remove the VLED devices from the initial substrate (not shown) adjacent to the n-doped layer upon which the semiconductor layers 302, 304, 306 were deposited. For one external connection, either the metal layer 310 can act as a p-electrode, or as depicted in FIG. 3, an additional protective metal p-electrode 314 can be added to the bottom of the metal layer 310 if needed to improve the contact resistance and the p-electrode integrity. For the other external connection, an n-electrode 312 is added to the top of the n-doped layer 302. A semi-transparent coating is not necessary since the n-doped layer 302 has good conductivity and the p-doped layer 306 has the metal layer 310 and reflective layer 308 to spread out the current.

Figure 4:
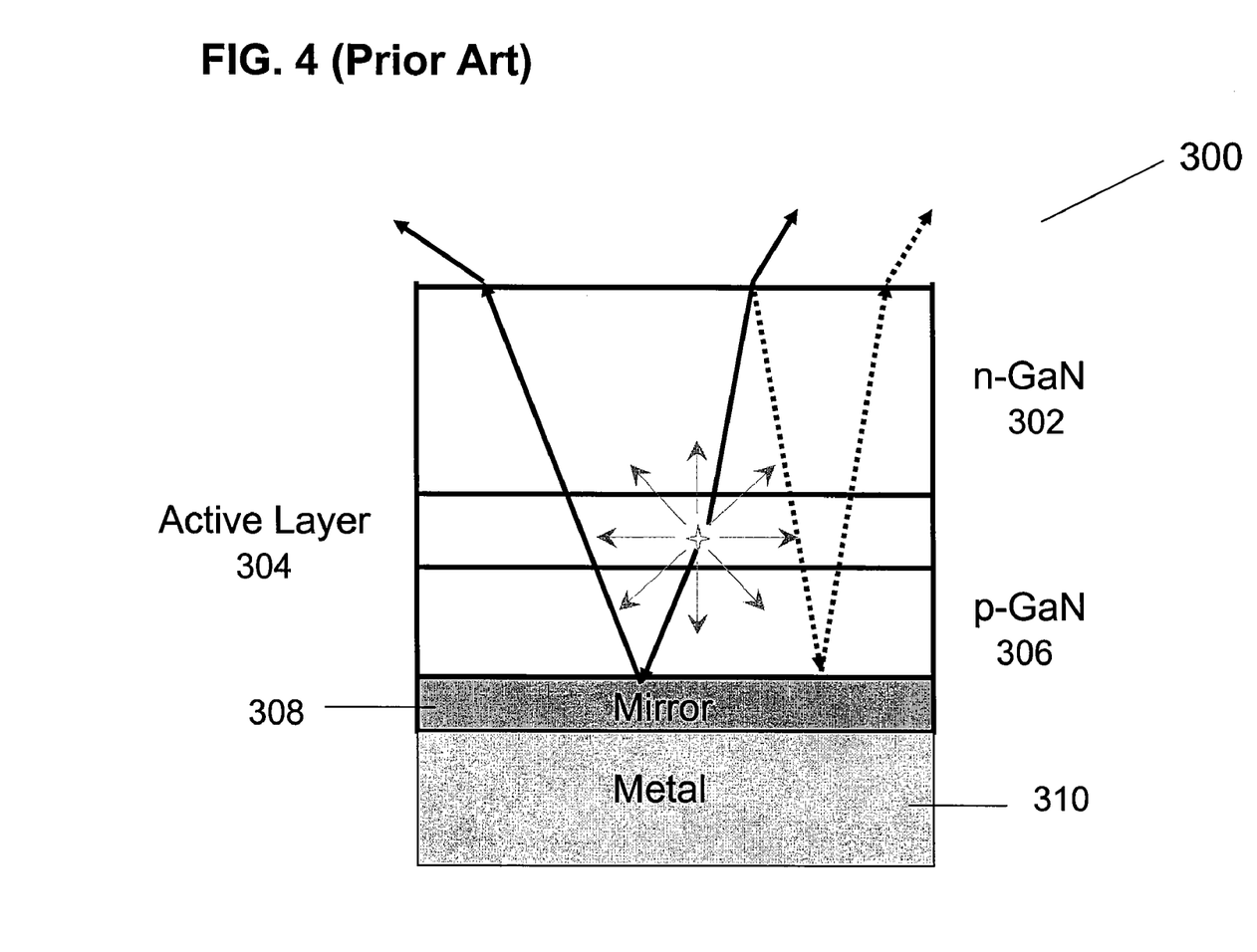
FIG. 4 is a diagram illustrating possible paths of photons for a conventional VLED.

FIG. 4 illustrates possible paths of photons for the typical VLED 300 described above and shown in FIG. 3. Photons generated in the active layer 304 are radiated and travel through the different layers of the VLED 300. Some photons travel through the n-doped layer 302 and escape as output light. Those photons that did not escape get reflected by the surface of the n-doped layer 302 and travel back through the VLED layers 302, 304, 306. Once they hit the reflective layer 308, they are again reflected to travel back through the p-doped layer 306, the active layer 304 and the n-doped layer 302 before expectantly escaping out. Other photons emitted from the active layer 304 travel into the p-doped layer 306, get reflected by the reflective layer 308, and then travel back through the VLED layers 302, 304, 306 as described above. Moreover, some of the photons will be absorbed in the various layers 302, 304, 306.

Despite the fact that many of the photons in the typical VLED 300 are eventually routed in the intended direction of light emission due to the reflective layer, some of the photons are absorbed and reduce the overall light output. Accordingly, what is needed is a VLED structure that maximizes the number of photons that are generated and that escape out of the n-doped layer to improve luminous efficiency.

SUMMARY OF THE INVENTION

One embodiment of the invention provides for a vertical light-emitting diode (VLED) structure. The structure generally includes a metal layer that may have a p-electrode for external connection, a reflective layer disposed above the metal layer, a p-doped layer disposed above the reflective layer, an active layer disposed above the p-doped layer, a means for separating the p-doped layer from the active layer, and an n-doped layer disposed above the active layer, wherein the n-doped layer has an n-electrode for external connection. For some embodiments, the means for separating the p-doped layer from the active layer may be a spacer comprising undoped, n-doped, or slightly Mg-doped chemical compounds of Al, Ga, In, and N in the ratio of $Al_xGa_yIn_zN$ where $0 \leq x, y, z \leq 1$. Some embodiments may also include a housing for encapsulating the structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a vertical light-emitting diode (VLED) structure that may impart increased luminous efficiency over conventional LEDs and VLEDs. As additional benefits, some embodiments may have less susceptibility to electrostatic discharge (ESD) and higher manufacturing yields than devices in the past.

Luminous efficiency is a function of both quantum efficiency and extraction efficiency. Quantum efficiency can be defined as the number of photons generated in the active layer for a given amount of electron input or power. Extraction efficiency for a VLED can be defined as the light intensity of photons escaped from the n-doped layer surface for a given amount of photons generated in the active layer. Whereas quantum efficiency is somewhat fixed for a given active layer, the extraction efficiency depends on the surrounding layers of the VLED structure. Embodiments of the invention incorporate an increased distance between the active layer and the reflective layer over conventional LEDs and VLEDs in an effort to maximize the extraction efficiency. For some embodiments, a spacer may be employed as described below.

An Exemplary VLED Structure

Figure 5:
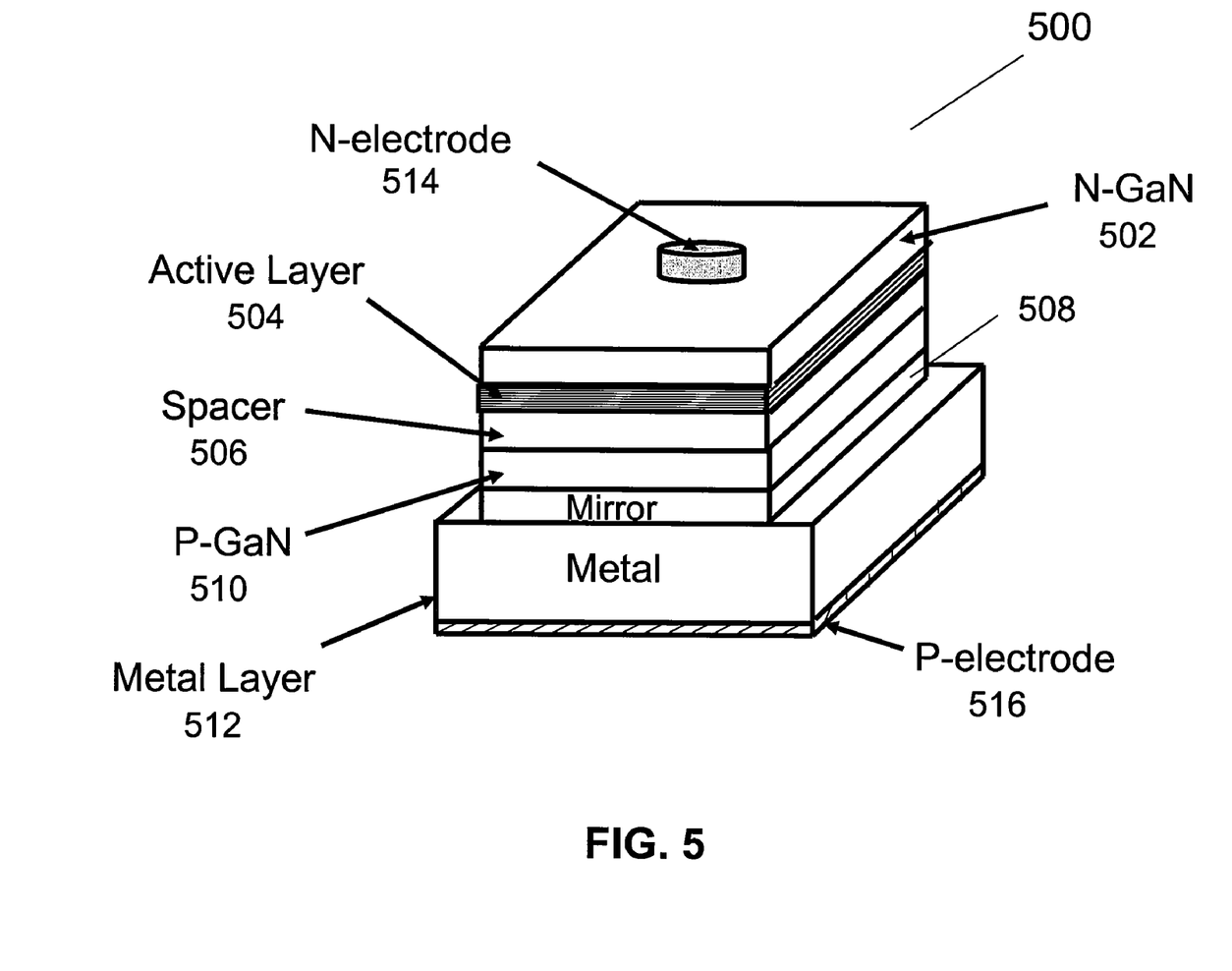
FIG. 5 is a cross-sectional schematic representation of a VLED structure with a spacer according to one embodiment of the invention.

FIG. 5 is a cross-sectional schematic representation of a VLED structure according to one embodiment of the invention. A VLED 500 may have been formed on a substrate (not shown), such as sapphire, suitable for creating semiconductor layers. An n-doped layer 502 comprising n-GaN, for example, may have been deposited on this substrate, and then a multiple quantum well (MQW) active layer 504 may have been formed above the n-doped layer 502. Instead of the thin, p-doped layer of conventional LEDs and VLEDs, however, a spacer layer 506 may be deposited for some embodiments.

The spacer layer 506 or other means may be exploited to increase the distance between the active layer 504 and a reflective layer 508 that may not have been formed on the VLED 500 yet in an effort to increase the luminous efficiency. Even though the physics are not fully understood, the use of a spacer layer 506 may change the phase of the photons generated in the MQW active layer 504. Having a thickness of 1 Å to 10000 Å, the spacer layer 506 may comprise a single layer or multiple layers that may comprise different materials. Materials suitable for the spacer layer 506 may include undoped, n-doped, or slightly magnesium-doped chemical compounds of aluminum (Al), gallium (Ga), indium (In), and nitrogen (N) in the ratio $Al_xGa_yIn_zN$ where $0 \leq x, y, z \leq 1$. For instance, AlN, GaN, InN, AlGaN, InGaN, AlInN and AlGaInN may be suitable spacer layer materials. Slightly Mg-doped layers of these materials should still maintain n-doped layer characteristics.

Above the spacer layer 506, a p-doped layer 510 may be deposited and may comprise p-GaN, for example. With the inclusion of the spacer layer 506 for some embodiments, the p-doped layer 510 may be thicker than the thin layer deposited in conventional LEDs and VLEDs. As such, the p-doped layer 510 may possess a thickness between 10 Å and 10000 Å. Embodiments of the invention with a spacer layer thickness of 700 Å and a p-doped layer thickness of 2000 Å were tested to have an efficiency of 70 lumens/watt. This efficiency was 40% better than a VLED with only a single p-doped layer having a thickness of 2700 Å. Even though the combined thickness of the p-doped layer 510 and the spacer layer 506 (if present) between the two devices was the same, the latter device only had a luminous efficiency of 50 lumens/watt. As soon as the doping in the spacer layer 506 becomes p-doping, the efficiency of the VLED structure may drop to a level similar to conventional VLEDs. It is speculated that the spacer layer 506 may have some effect on either the phase of the photons or the in-plane propagation mode of the photons. With an effect on the phase of the photons, the spacer layer 506 may reduce the destructive interference of photons incident upon and reflected back from the reflective layer 508. Regarding the second effect, the spacer layer 506 may suppress the in-plane propagation mode whereby generated photons travel along the MQW plane and seldom escape the VLED 500.

The reflective layer 508 may be formed above the p-doped layer 510 and may comprise a metal or a metal alloy of Ag, Au, Cr, Pt, Pd, Rh, or Al. A thick conductive metal layer 512 may be created above the reflective layer 508 and may comprise any suitable metal or metal alloy material such as Cu.

This metal layer 512 may dissipate heat more effectively than substrates, such as silicon and sapphire, of conventional LEDs and may be composed of one or more formed layers. The reflective layer 508 may be strategically placed and formed in an effort to reflect errant photons back into the intended direction of light emission. The reflective layer 508 may prevent photons from traveling beyond the semiconductor layers 502, 504, 506, 510 and into the metal layer 512 for absorption.

Once the metal layer 512 has been formed, a series of handling operations may occur that, in effect, flip the structure over and remove the VLED devices from the initial substrate (not shown) adjacent to the n-doped layer 502 upon which the semiconductor layers 502, 504, 506, 510 were deposited. A surface of the n-doped layer may be patterned in an effort to improve light extraction.

For one external connection, an n-electrode 514 may be connected to the n-doped layer 502. For the other external connection, the metal layer 512 may be used or a protective metal layer forming a separate p-electrode 516 may be connected to the metal layer 512. These electrodes 514, 516 may comprise any suitable material for electrical conduction, such as gold, tin, aluminum or silver. Although it is not shown in FIG. 5, a housing with leads provided for external electrical (and, in some cases, thermal) connection may encapsulate the VLED structure in some embodiments to incorporate the structure into an LED device.

Because the spacer layer 506 may serve to increase the resistance and spread out any currents between the active layer 504 and the p-doped layer 510, embodiments of the invention may possess lower susceptibility to electrostatic discharge (ESD) than conventional VLEDs. In addition, the inclusion of a spacer layer 506 for some embodiments may limit damage to the active layer 504 when the p-doped layer 510 is deposited, typically at high temperatures. Both of these benefits may help to increase the manufacturing yield of VLEDs according to embodiments of the invention.

Path of Photons in Exemplary VLED Structure

Figure 6:
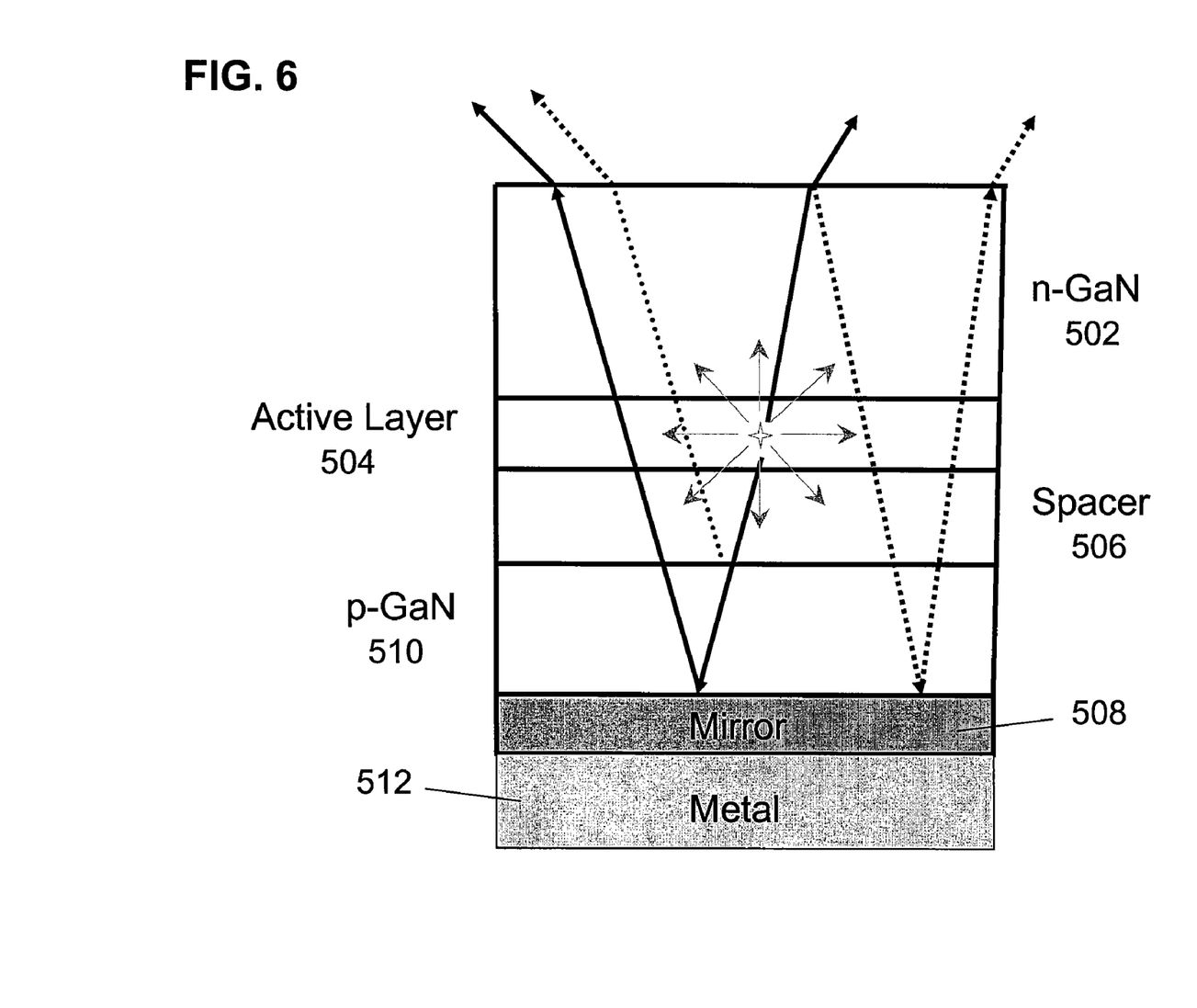
FIG. 6 is a diagram illustrating possible paths of photons for a VLED with a spacer according to one embodiment of the invention.

FIG. 6 illustrates possible paths of photons for a VLED 500 with a spacer layer as described above and shown in FIG. 5 according to one embodiment of the invention. Photons generated in the active layer 504 may be radiated and travel through the different layers of the VLED 500. Some photons may travel through the n-doped layer 502 and escape as output light. Those photons that did not escape may be reflected by the surface of the n-doped layer 502 and travel back through the VLED layers 502, 504, 506, 510. Once they hit the reflective layer 508, they may again be reflected to travel back through the p-doped layer 510, the spacer layer 506, the active layer 504 and the n-doped layer 502 before expectantly escaping out.

Other photons emitted from the active layer 504 may travel into the spacer layer 506, continue on into the p-doped layer 510, get reflected by the reflective layer 508, and then travel back through the VLED layers 502, 504, 506, 510 as described above. Still other photons irradiated from the active layer 504 may travel into the spacer layer 506, get reflected at a boundary between the spacer layer 506 and the p-doped layer 510, and then travel back through the spacer layer 506, the active layer 504, and the n-doped layer 502. Since some of the photons may be absorbed in the various layers 502, 504, 506, 510, reflections in the spacer layer 506 may reduce the amount of this absorption and increase the overall light extraction, hence leading to increased luminous efficiency.

While the foregoing is directed to embodiments of the present invention, other and further embodiments of the invention may be devised without departing from the basic scope thereof, and the scope thereof is determined by the claims that follow.

The invention claimed is:

1. A vertical light-emitting diode (VLED) structure comprising:
   a metal layer;
   a reflective layer disposed above the metal layer;
   a p-doped layer disposed above the reflective layer;
   a spacer disposed above the p-doped layer, wherein the spacer comprises a slightly Mg-doped chemical compound with n-type conduction characteristics;
   an active layer disposed above the spacer; and
   an n-doped layer disposed directly above the active layer, wherein the n-doped layer has an n-electrode for external connection.

2. The VLED structure of claim 1, wherein the chemical compound is a combination of aluminum (Al), gallium (Ga), indium (In), and nitrogen (N) with a ratio of $Al_xGa_yIn_zN$ where $0 \leq x, y, z \leq 1$.

3. The VLED structure of claim 1, wherein the spacer comprises multiple layers.

4. A vertical light-emitting diode (VLED) structure comprising:
   a metal layer;
   a reflective layer disposed above the metal layer;
   a p-doped layer disposed above the reflective layer;
   a spacer disposed above the p-doped layer, wherein the spacer comprises an undoped or an n-doped compound, wherein the spacer comprises multiple undoped or n-doped layers, wherein the multiple layers comprise different materials;
   an active layer disposed above the spacer; and
   an n-doped layer disposed directly above the active layer, wherein the n-doped layer has an n-electrode for external connection.

5. The VLED structure of claim 1, wherein the spacer has a thickness between 1 Å and 10000 Å.

6. The VLED structure of claim 1, wherein the p-doped layer has a thickness between 10 Å and 10000 Å.

7. The VLED structure of claim 1, wherein the p-doped layer comprises p-doped gallium nitride (p-GaN).

8. The VLED structure of claim 1, wherein the n-doped layer comprises n-doped gallium nitride (n-GaN).

9. The VLED structure of claim 1, wherein the metal layer comprises at least one of a metal and a metal alloy.

10. The VLED structure of claim 1, wherein the metal layer comprises multiple layers.

11. The VLED structure of claim 1, further comprising a p-electrode for external connection disposed below the metal layer.

12. A vertical light-emitting diode (VLED) structure comprising:
    a housing for encapsulating at least a portion of the structure;
    a metal layer having a p-electrode for external connection;
    a reflective layer disposed above the metal layer;
    a p-doped layer disposed above the reflective layer;
    a spacer disposed above the p-doped layer, wherein the spacer comprises a slightly Mg-doped chemical compound with n-type conduction characteristics;
    an active layer disposed above the spacer; and
    an n-doped layer disposed directly above the active layer, wherein the n-doped layer has an n-electrode for external connection.

13. The VLED structure of claim 12, wherein the chemical compound comprises a combination of aluminum (Al), gallium (Ga), indium (In), and nitrogen (N) with a ratio of $Al_xGa_yIn_zN$ where $0 \leq x, y, z \leq 1$.

14. The VLED structure of claim 12, wherein the spacer comprises multiple layers.

15. A vertical light-emitting diode (VLED) structure comprising:
- a housing for encapsulating at least a portion of the structure;
- a metal layer having a p-electrode for external connection;
- a reflective layer disposed above the metal layer;
- a p-doped layer disposed above the reflective layer;
- a spacer disposed above the p-doped layer, wherein the spacer comprises an undoped or an n-doped compound, wherein the spacer comprises multiple undoped or n-doped layers, wherein the multiple layers comprise different materials;
- an active layer disposed above the spacer; and
- an n-doped layer disposed directly above the active layer, wherein the n-doped layer has an n-electrode for external connection.

16. The VLED structure of claim 12, wherein the spacer has a thickness between 1 Å and 10000 Å.

17. A vertical light-emitting diode (VLED) structure comprising:
- a metal layer;
- a reflective layer disposed above the metal layer;
- a p-doped layer disposed above the reflective layer;
- an active layer disposed above the p-doped layer;
- a means for separating the p-doped layer and the active layer, wherein the means for separating is a multilayered undoped or n-doped compound; and
- an n-doped layer disposed directly above the active layer, wherein the n-doped layer has an n-electrode for external connection.

18. The VLED structure of claim 17, wherein the means for separating the p-doped layer and the active layer has a thickness between 1 Å and 10000 Å.

* * * * *